(12) United States Patent
Oka

(10) Patent No.: US 6,472,729 B1
(45) Date of Patent: Oct. 29, 2002

(54) SEMICONDUCTOR DEVICE

(75) Inventor: Takahiro Oka, Tokyo (JP)

(73) Assignee: OKI Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/188,184

(22) Filed: Nov. 10, 1998

(30) Foreign Application Priority Data

Jan. 22, 1998 (JP) .......................................... 10-010755

(51) Int. Cl.[7] .............................................. H01L 23/495
(52) U.S. Cl. ...................... 257/676; 666/670; 666/692; 666/618; 666/622; 666/623; 666/625
(58) Field of Search ................................ 257/676, 666, 257/670, 669, 687, 692, 618, 619, 622, 623, 625, 797, 730, 731, 732, 776, 667, 773, 674

(56) References Cited

U.S. PATENT DOCUMENTS

| | | | |
|---|---|---|---|
| 4,884,124 A | * 11/1989 | Mori et al. | 357/72 |
| 5,241,456 A | * 8/1993 | Marcinkiewicz et al. | 361/792 |
| 5,327,008 A | * 7/1994 | Djennas et al. | 257/666 |
| 5,708,295 A | * 1/1998 | Oga et al. | 257/676 |
| 5,895,969 A | * 4/1999 | Masuda et al. | 257/696 |
| 5,952,247 A | * 9/1999 | Livengood et al. | 438/734 |
| 6,166,431 A | * 12/2000 | Ohmori et al. | 257/679 |

FOREIGN PATENT DOCUMENTS

| JP | 405259360 | * 10/1993 |
|---|---|---|
| JP | 406053260 | * 2/1994 |

* cited by examiner

Primary Examiner—David L. Talbott
Assistant Examiner—Luan Thai
(74) Attorney, Agent, or Firm—Rabin & Berdo

(57) ABSTRACT

A semiconductor device chip packaged in the semiconductor device in accordance with this invention has one or more grooves engraved along the rear surface thereof to allow the grooves to receive one or more connection bars and a die pad or an island, if any, for the purpose to make the total thickness of the semiconductor device chip and the connection bar or bars and the die pad or the island, much thinner than the sum of the thickness of the semiconductor device chip and the thickness of the connection bar or bars and the die pad or the island, for the ultimate purpose to cause the finished or molded thickness of the semiconductor device in accordance with this invention to be as thin as 1.0 mm, resultantly allowing a semiconductor ingot having a diameter of 300 mm for producing a semiconductor device chip to be molded in the semiconductor device in accordance with this invention.

25 Claims, 12 Drawing Sheets

F I G. 5
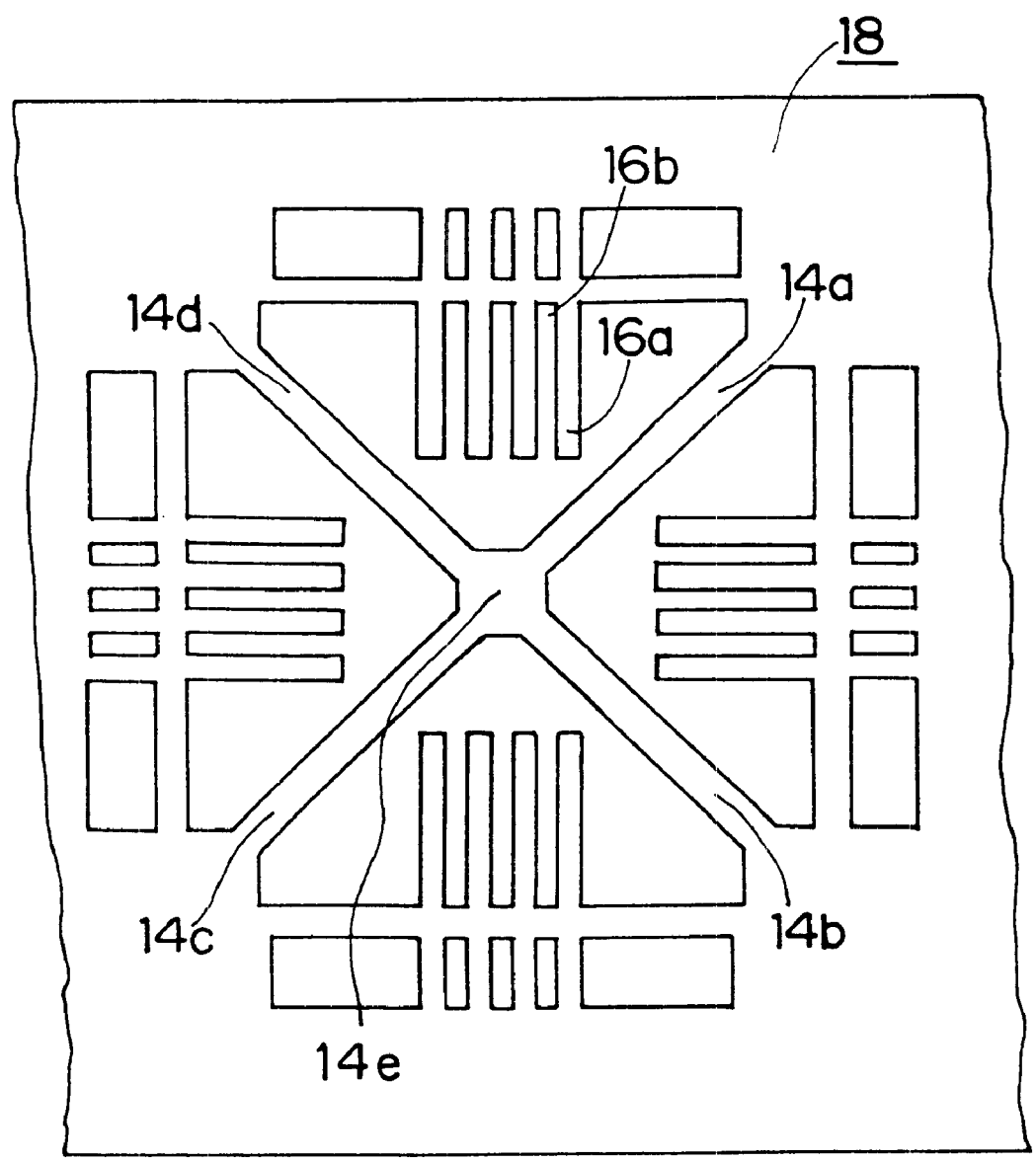

F I G. 1 6
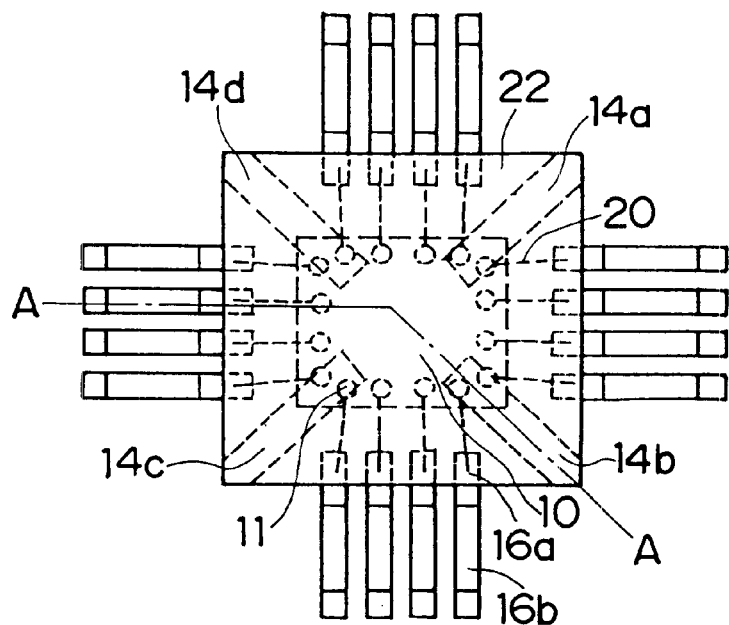
F I G. 1 7
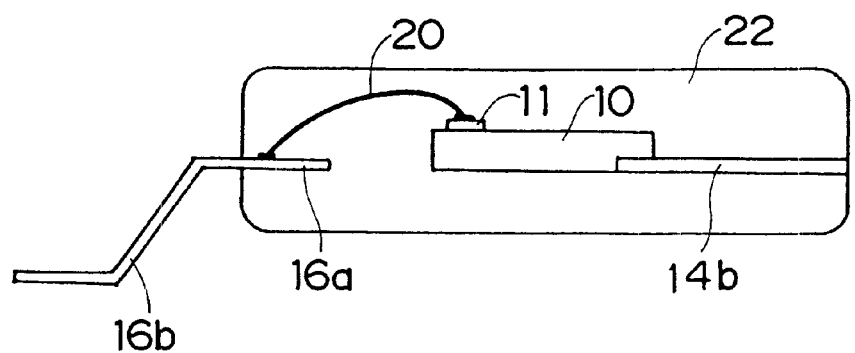

SEMICONDUCTOR DEVICE

FIELD OF THE INVENTION

This invention relates to an improvement applicable to a semiconductor device packaged in a molded package. More specifically, this invention relates to an improvement developed for decreasing the thickness of the semiconductor device packaged in a molded package.

BACKGROUND OF THE INVENTION

A semiconductor device is confined in a package so as to protect the semiconductor device from external hazards including mechanical injury, chemical or fluidic contact, and/or radioactive irradiation. The semiconductor package is classified into a casket type package made of a ceramic et al., and a molded package which is defined as a package made of a plastic material or a material containing a plastic adhesive and ceramic particles formed in a mold covering a semiconductor device chip proper. This invention relates to an improvement applicable to a semiconductor device packaged in a molded package, and particularly in a molded plastic package.

Under the category of a molded package, a quad flat package is available. The quad flat package is defined as a molded package confining a semiconductor device chip having a shape of a quadrilateral and having a plurality of pins extending in the four or quadruple directions therefrom.

Referring to the drawings, the structure of a semiconductor device packaged in a quad flat package available in the prior art will be described below.

Referring to FIG. 1, a plan view of a semiconductor device packaged in a quad flat package available in the prior art is illustrated. A semiconductor device chip 50, in which at least one semiconductor device element is disposed and on which plural bonding pads 51 are arranged, is adhered on a die pad or an island 52 employing a silver paste 53 et al. (See FIG. 2.). Each of the bonding pads 51 is connected with a respective inner lead 56a extending toward an outer lead 56b, employing a bonding wire 60 made of Au, Al or Cu, and the die pad or the island 52 extends to four connection bars 54. The above components, as a whole, are molded in one bulk of a plastic mold 62 of which the external side wall is shown by a solid line.

Referring to FIG. 2, which is a cross section of FIG. 1 taken along line A—A shown in FIG. 1, the die pad or the island 52 stands on a different level from the connection bar 54 and the inner lead 56a, so that the heights or distances between the top surface of the semiconductor device chip 50 and the top surface of the plastic mold 62, and between the rear surface of the die pad or the island 52 and the rear surface of the plastic mold 62 are about the same. This causes the flow of a molten resin to become smooth, and cause the shape of the plastic mold 62 to become precisely identical to the designed shape. The object of a bending step of the outer leads 56b is to make the step for mounting the semiconductor device easy.

It is well-known that the foregoing semiconductor device packaged in a quad flat package is fabricated, as will be described below.

Referring to FIG. 3, a lead frame 58 is prepared. The lead frame 58 is an endless tape made of 42 alloy (an alloy containing 42% of Ni and 58% of Fe), a Cu alloy, stainless steel or a Ni alloy and which has a plurality of die pads or the islands 52, connection bars 54, inner leads 56a, and outer leads 56b, all of which are arranged as shown in the drawing. After the level of the die pads or the islands 52 is slightly lowered as is illustrated in FIG. 2, a semiconductor device chip 50 shown in a broken line B is adhered on each of the die pads or islands 52, and a wire bonding process is conducted to connect each of the bonding pads 51 shown in broken lines and each of the inner leads 56a employing bonding wires 60 made of Au, Al or Cu shown in broken lines. Then, a plastic molding process is conducted to form a plastic mold 62 shown in a broken line C. Thereafter, the inner leads 56a are discontinued from the outer leads 56b along lines D—D. As the final step, the level of the outer leads 56b is slightly lowered.

The demand of cellular phones is increasing at a remarkable rate, and it is noted that a large quantity of semiconductor devices packaged in quad flat packages is employed for cellular phones.

At the present technical level, the least (smallest) thickness of the semiconductor devices packaged in quad flat packages is approximately 1.0 mm. This thickness is satisfactory in view of the requirement originated from the cellular phone makers, provided the thickness of the semiconductor device chip is within a range of 150 μm through 300 μm. This thickness range of semiconductor device chips can be realized, provided a semiconductor wafer having a diameter of 200 mm is employed.

In the wake of increasingly more serious requirements for a higher grade of integration and for an increasingly larger quantity of pins for a semiconductor device, the external dimension of a semiconductor device packaged in a quad flat package is increasingly larger as well.

Since the production cost of a semiconductor device largely depends on the quantity of semiconductor device chips produced from one semiconductor wafer, which quantity determines the cumulative number of production steps, it is required to employ a semiconductor wafer having a larger diameter such as 300 mm. Such being the case, it is difficult to slice a semiconductor wafer having a variety of thickness of 150 μm through 300 μm, due to the problem of warp and cracks. In other words, if a semiconductor wafer having a variety of thickness of 150 μm through 300 μm is sliced from a semiconductor ingot having a diameter of 300 mm, the sliced semiconductor wafer readily warps and/or is cracked or broken. As a result, it is difficult to produce a semiconductor wafer having a diameter of 300 mm from a semiconductor ingot having a diameter of 300 mm. In conclusion, if a semiconductor ingot having a diameter of 300 mm is employed, a larger thickness will have to be accepted for a semiconductor wafer to be sliced therefrom.

OBJECT AND SUMMERY OF THE INVENTION

Accordingly, an object of this invention is to provide a semiconductor device packaged in a molded package wherein the finished or molded thickness is in the approximate range of 1.0 mm, despite the thickness range of the semiconductor device chip to be packaged therein is larger than the conventional range of 150 μm through 300 μm.

To achieve the foregoing object, a semiconductor device chip packaged in the semiconductor device in accordance with this invention has one or more grooves engraved along the rear surface thereof to allow the grooves to receive one or more connection bars and a die pad or an island, if any, for the purpose to make the total thickness of the semiconductor device chip and the connection bar or bars and the die pad or the island, if any much thinner than the sum of the thickness of the semiconductor device chip and the thickness of the connection bar or bars and the die pad or the island, if any.

More specifically, a semiconductor device in accordance with this invention is provided with:

either a combination of a die pad and connection bars or a plurality of connection bars for supporting a semiconductor device chip further provided with:

at least one semiconductor device element disposed in the semiconductor device chip, a plurality of bonding pads arranged along sides of a top surface of the semiconductor device chip, and a groove engraved along a rear surface of the semiconductor device chip to receive the foregoing combination of a die pad and connection bars or the foregoing plurality of connection bars, a plurality of combination of an inner lead and an outer lead, each of the plurality being connected with each of the bonding pads, and a plastic mold confining the semiconductor device chip supported by the foregoing combination of a die pad and connection bars or the foregoing plurality of connection bars.

In the foregoing semiconductor device, the plurality of connection bars can be plural bars crossing each other, plural short bars long enough to support only the corners of or the sides of the semiconductor device chip.

BRIEF DESCRIPTION OF THE DRAWINGS

This invention, together with its various features and advantages, can be readily understood from the following more detailed description presented in conjunction with the following drawings, in which:

FIG. 5 is a plan view of a lead frame employable for production of a semiconductor device in accordance with the first embodiment of this invention, FIG. 16 is a plan view of a semiconductor device in accordance with the third embodiment of this invention, FIG. 17 is a cross section of FIG. 16 taken along line A—A shown in FIG. 16 or a cross section of a semiconductor device in accordance with the third embodiment of this invention.

DETAILED DESCRIPTION OF THE PREFERRED EMBODIMENTS

Referring to drawings, semiconductor devices each of which is packaged in a molded package, in accordance with four independent embodiments of this invention will be described below.

First Embodiment

A semiconductor device provided with a semiconductor device chip having a set of grooves engraved along the rear surface thereof to receive a die pad or an island and a set of connection bars at the corners thereof and with a plurality of pins extending in quadruple directions and being covered by a plastic molded package.

Figure 1:
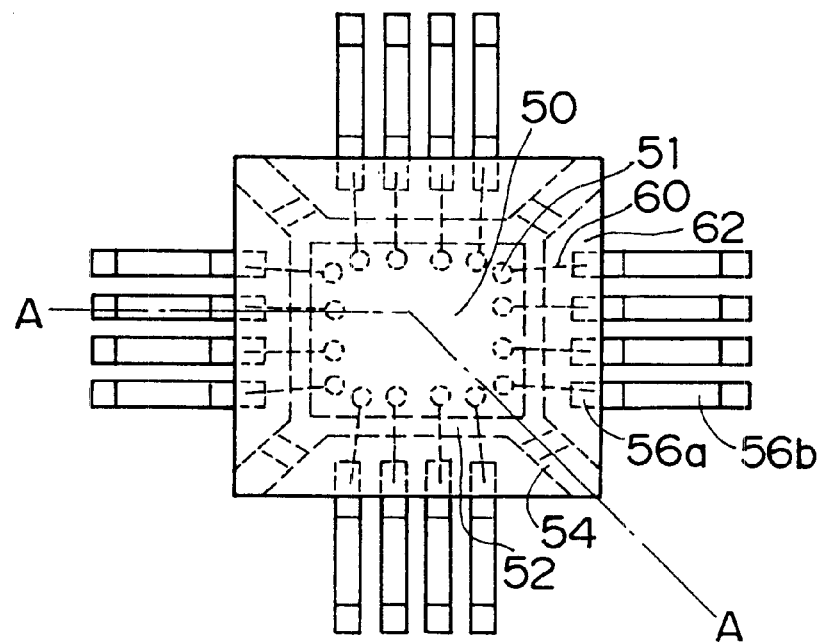
FIG. 1 is a plan view of a semiconductor device packaged in a quad flat package available in the prior art.
Figure 2:
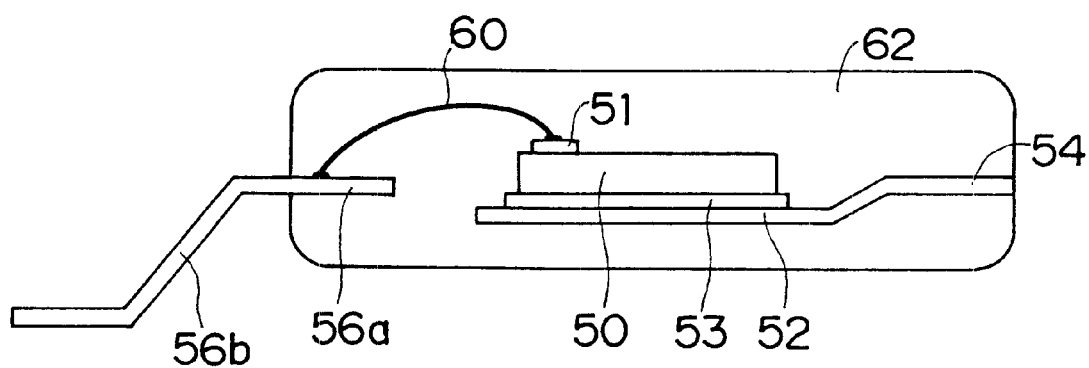
FIG. 2 is a cross section of FIG. 1 taken along line A—A.
Figure 3:
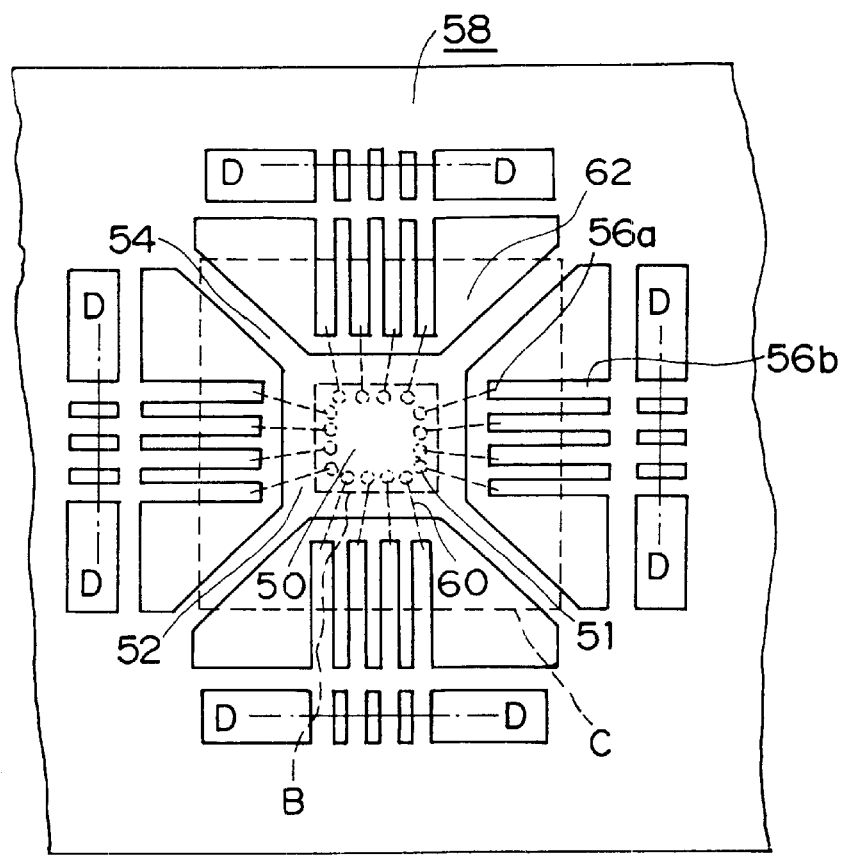
FIG. 3 is a plan view of a lead frame available in the prior art, under a process for mounting a semiconductor device chip thereon.
Figure 4:
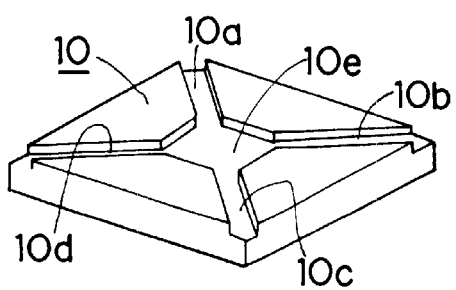
FIG. 4 is a perspective view of the rear surface of a semiconductor device chip employable for producing a semiconductor device in accordance with the first embodiment of this invention.

Referring to FIG. 4, a photolithography process employing a chemical etching process or a mechanical engraving process employing a scribing machine is employed to produce a combined groove having a horizontal shape of a quadrilateral 10e (i.e., a first groove or recess of the combined groove) attached by four sides (i e., further grooves of the combined groove) 10a, 10b, 10c and 10d extending in radial directions from the corners thereof, along the rear surface of a semiconductor device chip 10 in which at least one semiconductor device element has been produced and on which plural bonding pads 11 have been produced along the periphery thereof (See FIGS. 5, 6, 7 and 8.). By extending the grooves from the corners, the chip 10 can be more stably supported by the connection bars, as compared to grooves that extend perpendicular to a side edge of the chip. The depth of the grooves 10e and 10a, 10b, 10c and 10d is selected to be identical to or less than the thickness of a die pad or an island 12 and connection bars 14a, 14b, 14c and 14d which are scheduled to be arranged in the grooves 10e and 10a, 10b, 10c and 10d (See FIG. 9.).

Referring to FIG. 5, a lead frame 18 is prepared, which is an endless tape made of 42 alloy (an alloy containing 42% of Ni and 58% of Fe), a Cu alloy, stainless steel or a Ni alloy and having a die pad 14e having a horizontal shape of a square or a rectangle and being suspended by connection bars 14a, 14b, 14c and 14d extending in radial directions from the corners of the die pad 14e and plural straight bars 16a and 16b each of which is a continuous bar consisting of an inner lead 16a and an outer lead 16b.

Figure 6:
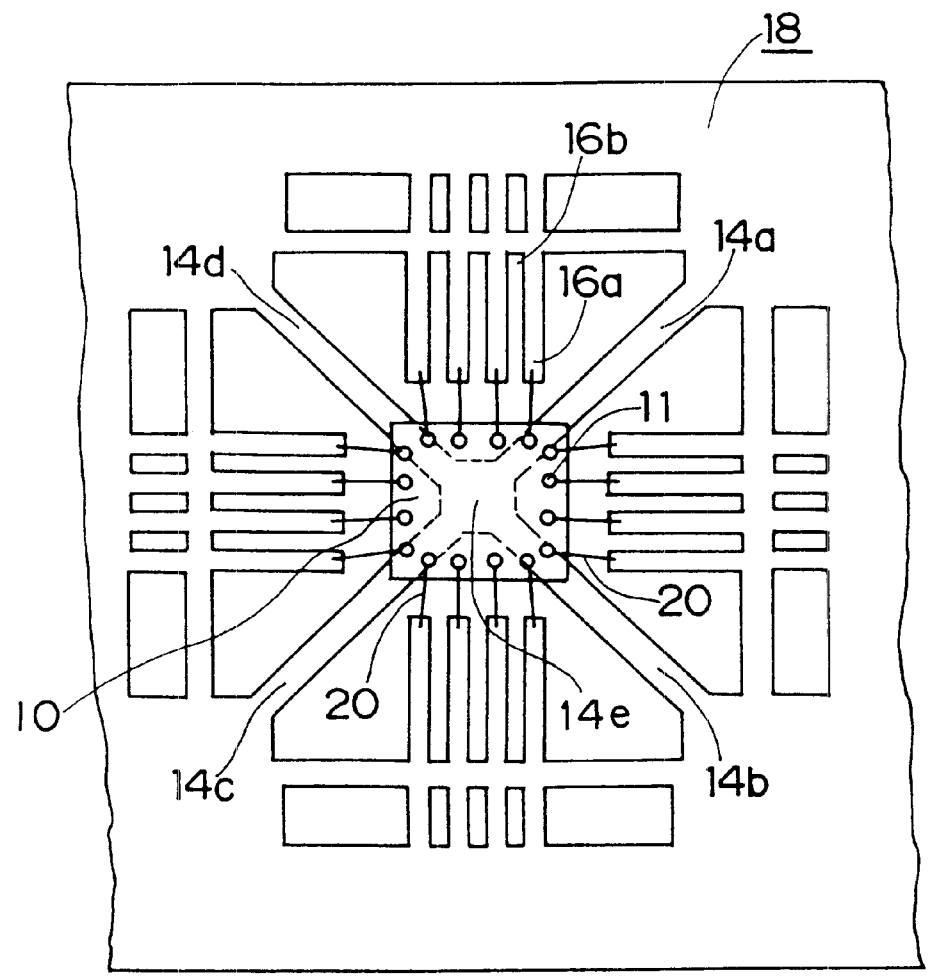
FIG. 6 is a plan view of a combination of a lead frame and a semiconductor device chip, under a process for producing a semiconductor device in accordance with the first embodiment of this invention.

Referring to FIG. 6, an Ag paste or the like is applied to the surface of the grooves engraved along the rear surface of the semiconductor device chip 10, and the semiconductor device chip 10 is placed on the lead frame 18 in a manner that the die pad or the island 14e and the connection bars 14a, 14b, 14c and 14d face respectively the groove 10e and the grooves 10a, 10b, 10c and 10d.

A wire bonding process is conducted to connect each of the bonding pads 11 with each of the inner leads 16a employing a bonding wire 20 made of AU et al.

Figure 7:
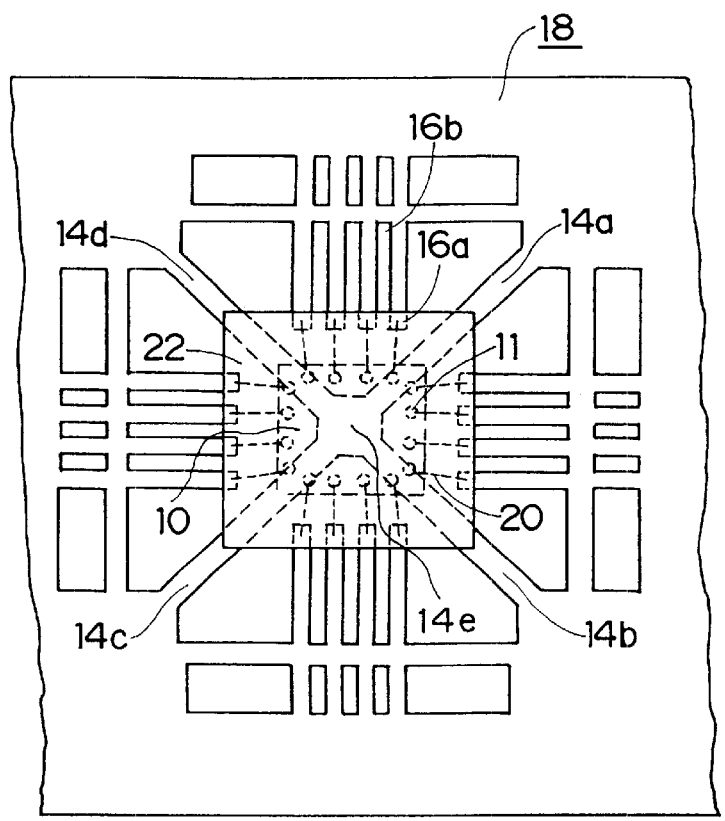
FIG. 7 is a plan view of a combination of a lead frame and a molded semiconductor device chip, under a process for producing a semiconductor device in accordance with the first embodiment of this invention.

Referring with FIG. 7, a plastic molding process is conducted to mold the semiconductor device chip 10 adhered on the die pad or the island 14e suspended by the connection bars 14a, 14b, 14c and 14d connected with the frame of the lead frame 18. The bonding pads 11 of the semiconductor device chip 10 are connected with the inner leads 16a by bonding wires 20. A label 22 has been given to the molded plastic package.

Figure 8:
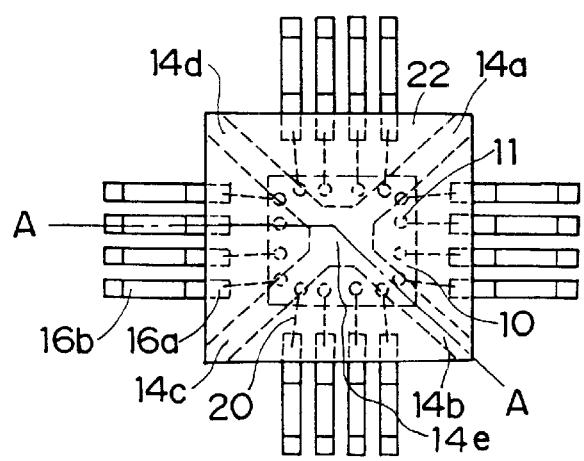
FIG 8 is a plan view of a semiconductor device in accordance with the first embodiment of this invention.

Referring to FIG. 8, each end of the outer leads 16b is discontinued from the frame of the lead frame 18, before each end of the outer leads 16b is deformed into a zigzag shape.

Figure 9:
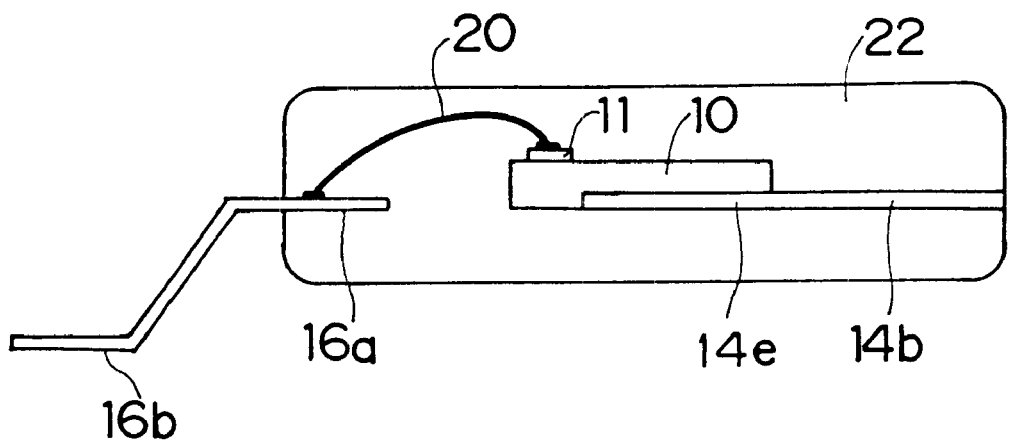
FIG. 9 is a cross section of FIG. 8 taken along line A—A shown in FIG. 8 or a cross section of a semiconductor device in accordance with the first embodiment of this invention.

As a result, the cross section of the semiconductor device packaged in a molded package in accordance with the first embodiment of this invention taken along line A—A shown in FIG. 8 becomes as is illustrated in FIG. 9.

In the foregoing example, the semiconductor device chip 10 is made from a semiconductor ingot having a diameter of 300 mm, and the thickness thereof is 450 $\mu$m, i.e., much larger than that of the prior art which varies between 150 $\mu$m and 300 $\mu$m. The depth of the grooves 10a, 10b, 10c, 10d and 10e is selected to be identical to the thickness of the lead frame 18 or 150 $\mu$m. As a result, the rear surface of the die pad 14e and of the connection bars 14a, 14b, 14c and 14d is flush with the rear surface of the semiconductor device chip 10. Allowing a thickness of 27.5 $\mu$m for each of the upper and lower layers of the plastic mold 22 on the top surface of the semiconductor device chip 10 and below the rear surface of the semiconductor device chip 10, the total thickness of the finished or molded semiconductor device in accordance with the first embodiment of this invention is successfully made 1.0 mm, fully satisfying the requirement derived from semiconductor devices employable for cellular phones.

The selection of the depth of the grooves 10a, 10b, 10c and 10d and 10e which is identical to the thickness of the die pad 14e and of the connection bars 10a, 10b, 10c and 10d is not imperative, although the foregoing condition is the optimum.

The horizontal shape of the die pad or the island 14e is entirely free. A disc, an oval and a triangle are included in the selection.

Second Embodiment

A semiconductor device provided with a semiconductor device chip having a set of grooves engraved along the rear surface thereof to receive one or more connection bars therein, the set of grooves having a shape of a cross passing through the corners of a semiconductor device chip to be arranged thereon, and with a plurality of pins extending in quadruple directions and being covered by a molded plastic package.

Figure 10:
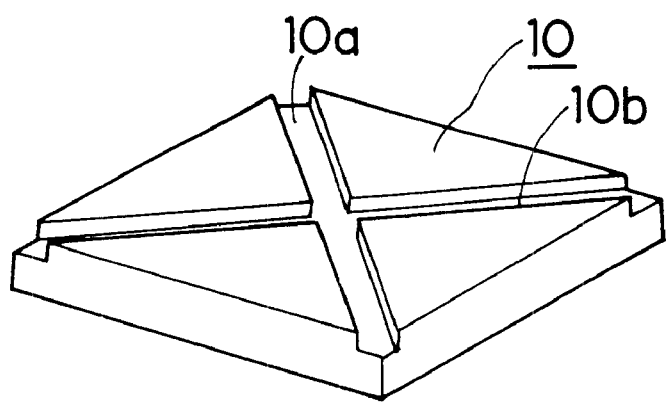
FIG. 10 is a perspective view of the rear surface of a semiconductor device chip employable for producing a semiconductor device in accordance with the second embodiment of this invention.
Figure 13:
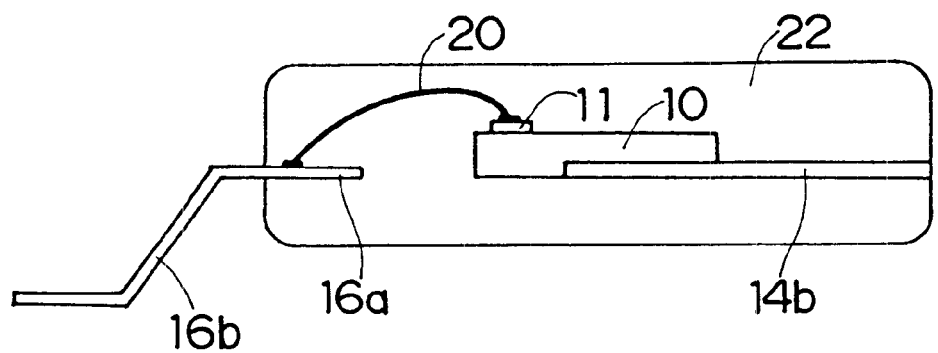
FIG. 13 is a cross section of FIG. 12 taken along line A—A shown in FIG. 11 or a cross section of a semiconductor device in accordance with the second embodiment of this invention.

Referring to FIG. 10, a scribing machine is employed to engrave one or two grooves 10a and 10b having a horizontal shape of connection bars, and having a cross section of a rectangle, along the rear surface of a semiconductor device chip 10 in which at least one semiconductor device element has been produced and on which plural bonding pads 11 have been produced along the periphery thereof (See FIG. 13.). It is important to adjust the height of a blade, if a scribing machine available in the prior art is employed.

It is needless to emphasize that a photolithography process can be employed for the process to produce the grooves 10a and 10b along the rear surface of the semiconductor device chip 10.

In the case where the number of the grooves is one, the direction of the single groove would be parallel to the side of the semiconductor device chip 10.

The depth of the grooves 10a and 10b is selected to be identical to or less than the thickness of the connection bars 14a, 14b, 14c and 14d (See FIGS. 11, 12 and 13.), although the former selection causes an optimum result.

A lead frame identical to that which is illustrated in FIG. 5 excepting that the die pad 14e is not available, is prepared.

Figure 11:
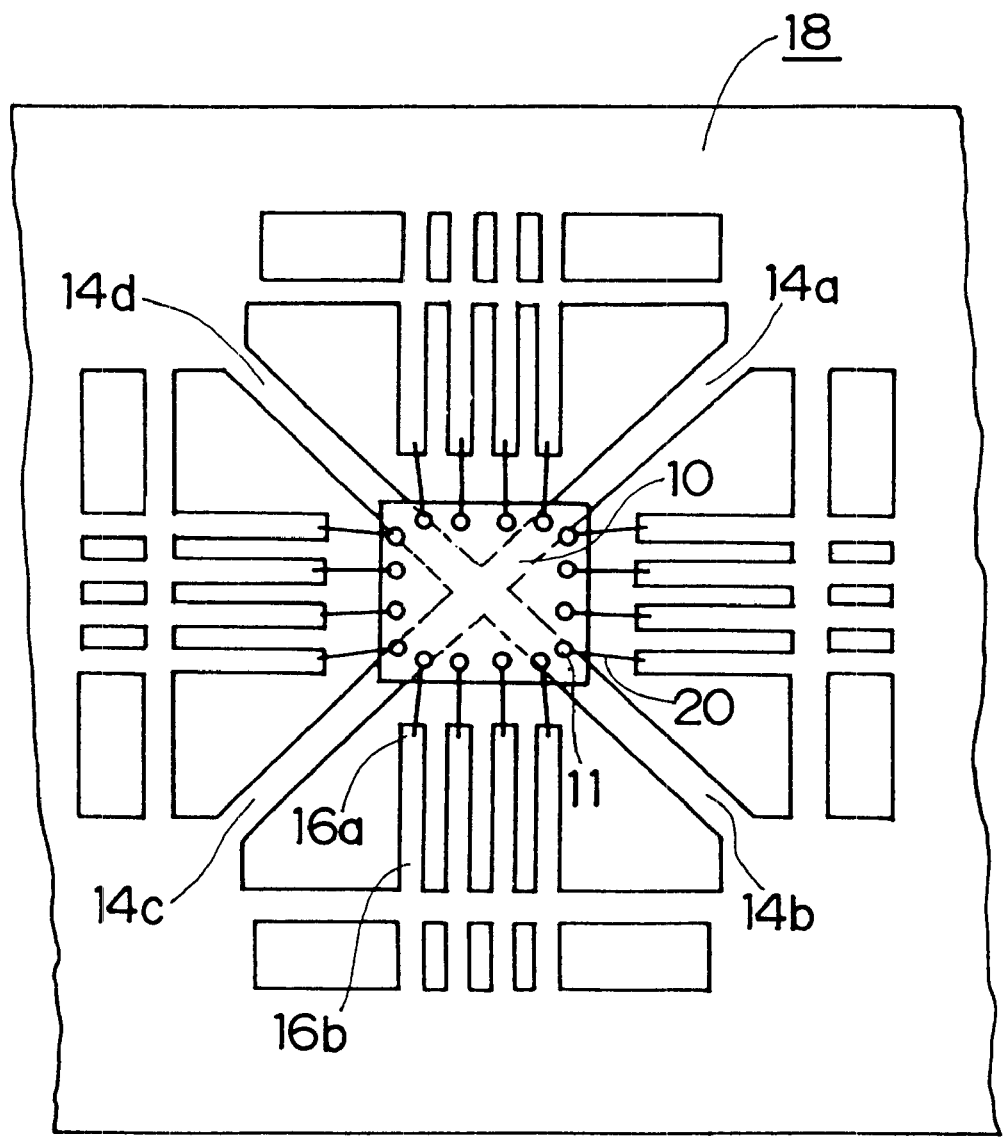
FIG. 11 is a plan view of a combination of a lead frame and a semiconductor device chip, under a process for producing a semiconductor device in accordance with the second embodiment of this invention, FIG. 12 a plan view of a semiconductor device in accordance with the second embodiment of this invention.

Referring to FIG. 11, an Ag paste or the like is applied to the surface of the grooves 10a and 10b of the semiconductor device chip 10, and the semiconductor device chip 10 is placed on the lead frame 18 in a manner similar to that which was employed for the first embodiment.

A wire bonding process is conducted in a manner similar to that which was employed for the first embodiment.

Referring to FIG. 7 again, a plastic molding process is conducted to mold the semiconductor device chip 10 in a manner similar to that which was employed for the first embodiment. The molded plastic package is shown by a label 22.

Figure 12:
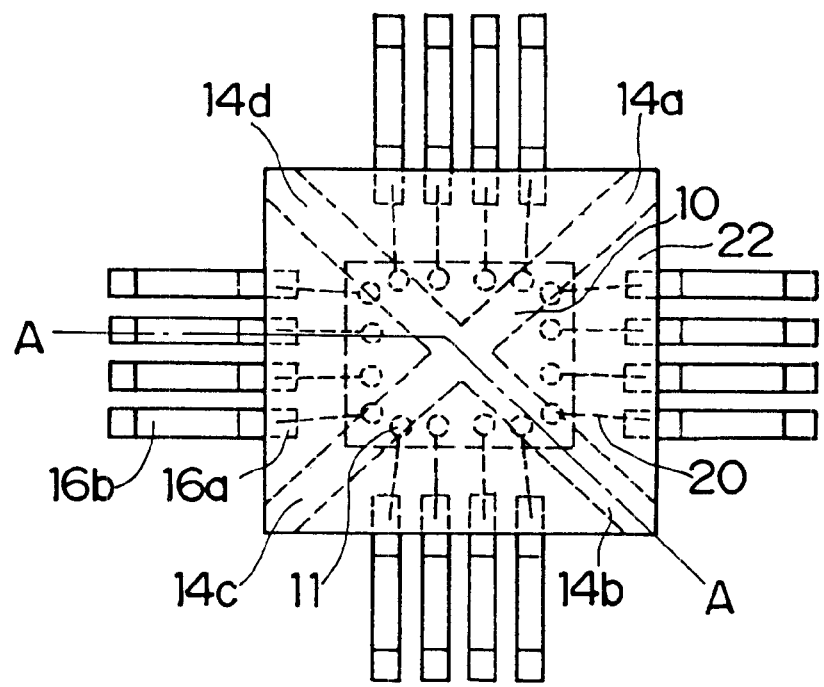

Referring to FIG. 12, each end of the outer leads 16b is discontinued from the frame of the lead frame 18, before each end of the outer leads 16b is deformed into a zigzag shape.

As a result, the cross section of the semiconductor device in accordance with the second embodiment of this invention taken along line A—A shown is FIG. 12 becomes as is illustrated in FIG. 13.

In the foregoing example as well, the semiconductor device chip 10 is produced from a semiconductor ingot having a diameter of 300 mm, and the thickness thereof is 450 $\mu$m. The depth of the grooves 10a and 10b is selected to be identical to the thickness of the lead frame 18 or 150 $\mu$m. As a result, the rear surface of the connection bars 14a and 14b is flush with the rear surface of the semiconductor device chip 10. Allowing a thickness of 27.5 $\mu$m for each of the upper and lower layers of the plastic mold 22 on the top surface of the semiconductor device chip 10 and below the rear surface of the semiconductor device chip 10, the total thickness of the finished or molded semiconductor device in accordance with the second embodiment of this invention is successfully made 1.0 mm, fully satisfying the requirement derived from semiconductor devices employable for cellular phones.

Third Embodiment

A semiconductor device provided with a semiconductor device chip having a set of grooves engraved along the rear surface thereof to receive two or more connection bars each of which is long enough to support each of the corners of the semiconductor device chip therein and with a plurality of pins extending in quadruple directions and being covered by a plastic package.

Figure 14:
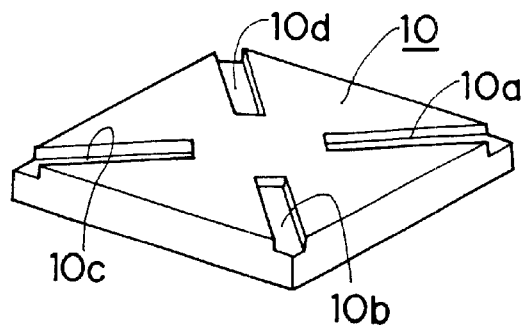
FIG. 14 is a perspective view of the rear surface of a semiconductor device chip employable for producing a semiconductor device in accordance with the third embodiment of this invention.
Figure 15:
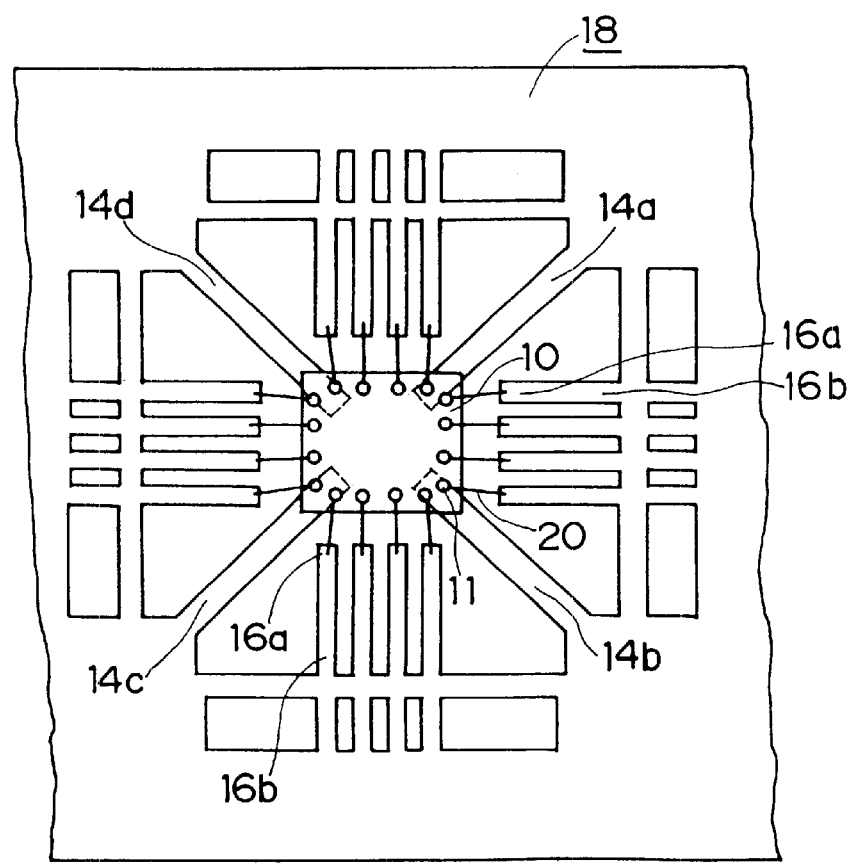
FIG. 15 is a plan view of a combination of a lead frame and a semiconductor device chip, under a process for producing a semiconductor device in accordance with the third embodiment of this invention.

Referring to FIG. 14, a scribing machine is employed to engrave two or more grooves 10a, 10b, 10c and 10d having a horizontal shape of connection bars 14a, 14b, 14c and 14d but having a length shorter than the corresponding ones of the second embodiment or a length long enough to support each of the corners of the semiconductor device chip(See FIGS. 15, 16 and 17.) and having a cross section of a rectangle, along the rear surface of a semiconductor device chip 10 in which at least one semiconductor device element has been produced and on which plural bonding pads 11 have been produced along the periphery thereof (See FIGS. 15, 16 and 17.). It is important to adjust the height of a blade, if a scribing machine available in the prior art is employed.

It is needless to emphasize that a photolithography process can be employed for the process to produce the grooves 10a, 10b, 10c and 10d along the rear surface of the semiconductor device chip 10.

In the case where the number of the grooves is two, the direction of the grooves would be parallel to the side of the semiconductor device chip 10.

The depth of the grooves 10a, 10b, 10c and 10d is selected to be identical to or less than the thickness of the connection bars 15a, 15b, 15c and 15d (See FIGS. 15, 16 and 17.), although the former selection causes an optimum result.

A lead frame identical to that which is illustrated in FIG. 5 excepting that the die pad 14e is not available and the length of the connection bars 14a, 14b, 14c and 14d is short enough to reach the corners of a semiconductor device chip to be arranged thereon, is prepared.

Referring to FIG. 15, an Ag paste or the like is applied to the surface of the grooves 10a, 10b, 10c and 10d of the semiconductor device chip 10, and the semiconductor device chip 10 is placed on the lead frame 18 in a manner similar to that which was employed for the first and second embodiments.

A wire bonding process is conducted in a manner similar to that which was employed for the first and second embodiments to connect each of the bonding pads 11 with each of the inner leads 16a employing bonding wires 20 made of AU et al.

Referring to FIG. 7 a third time, a plastic molding process is conducted to mold the semiconductor device chip 10 in a manner similar to that which was employed for the first or second embodiments. The molded plastic package is shown by a label 22.

Referring to FIG. 16, each end of the outer leads 16b is discontinued from the frame of the lead frame 18, before each end of the outer leads 16b is deformed into a zigzag shape.

As a result, the cross section of the semiconductor device in accordance with the third embodiment of this invention taken along line A–A shown is FIG. 16 becomes as is illustrated in FIG. 17.

In the foregoing example as well, the semiconductor device chip 10 is produced from a semiconductor ingot having a diameter of 300 mm, and the thickness thereof is 450 $\mu$m. The depth of the grooves 10a, 10b, 10c and 10d is selected to be identical to the thickness of the lead frame 18 or 150 $\mu$m. As a result, the rear surface of the connection bars 15a, 15b, 15c and 15b is flush with the rear surface of the semiconductor device chip 10. Allowing a thickness of 27.5 $\mu$m for each of the upper and lower layers of the plastic mold on the top surface of the semiconductor device chip 10 and below the rear surface of the semiconductor device chip 10, the total thickness of the finished or molded semiconductor device in accordance with the third embodiment of this invention is successfully made 1.0 mm, fully satisfying the requirement derived from semiconductor devices employable for cellular phones.

Fourth Embodiment

A semiconductor device provided with a semiconductor device chip having a set of grooves engraved along the rear surface thereof to receive two or more connection bars each of which is long enough to support each of the sides of the semiconductor device chip therein and with a plurality of pins extending in quadruple directions and being covered by a plastic package.

Figure 18:
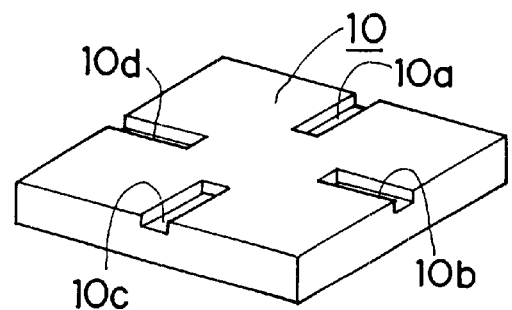
FIG. 18 is a perspective view of the rear surface of a semiconductor device chip employable for producing a semiconductor device in accordance with the fourth embodiment of this invention.

Referring to FIG. 18, a scribing machine is employed to engrave two or more grooves 10a, 10b, 10c and 10d having a horizontal shape of connection bars, but having a length which does not reach the center thereof but reaches only the sides thereof in a direction perpendicular to the sides of the semiconductor device chip and having a cross section of a rectangle, along the rear surface of a semiconductor device chip 10 in which at least one semiconductor device element has been produced and on which plural bonding pads 11 have been produced along the periphery thereof. It is important to adjust the height of a blade, if a scribing machine available in the prior art is employed. It is needless, however, to change a direction of the dicing saw from the ordinary direction for dicing scribe lines.

It is needless to emphasize that a photolithography process can be employed for the process to produce the grooves 10a, 10b, 10c and 10d along the rear surface of the semiconductor device chip 10.

The depth of the grooves 10a, 10b, 10c and 10d is selected to be identical to or less than the thickness of the connection bars 14a, 14b, 14c and 14d, although the former selection causes an optimum result.

A lead frame identical to that which is illustrated in FIG. 5 excepting that the die pad 14e is not available and the length of the connection bars 14a, 14b, 14c and 14d is short enough to reach only the sides of a semiconductor device chip 10 to be arranged thereon, is prepared.

Figure 19:
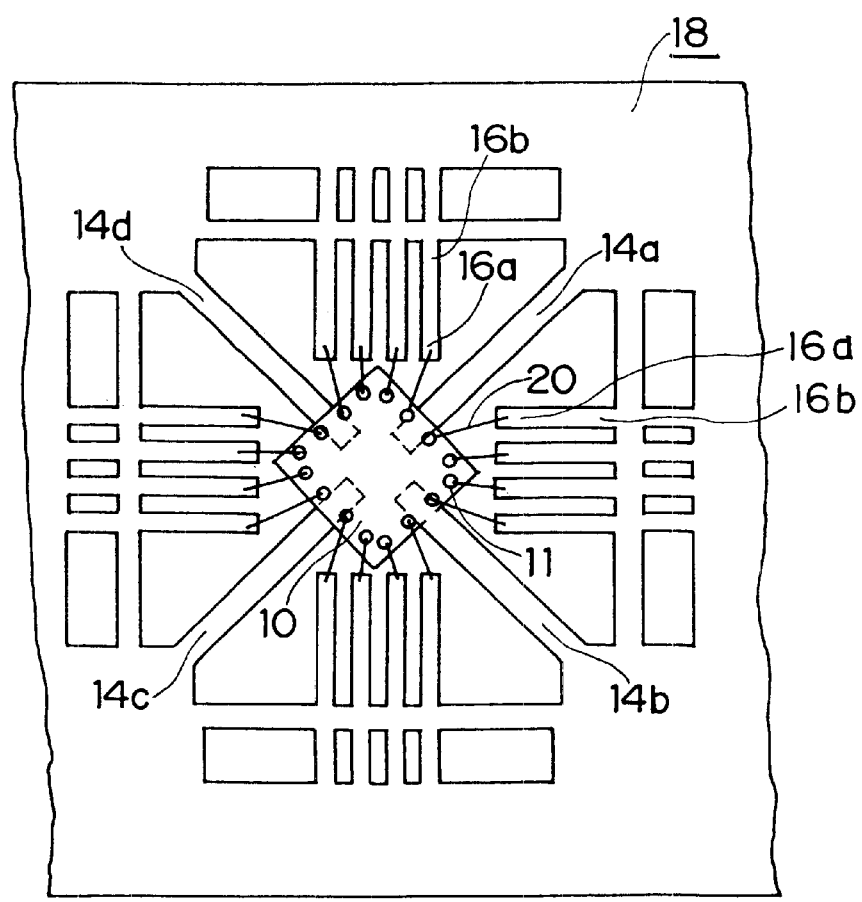
FIG. 19 is a plan view of a combination of a lead frame and a semiconductor device chip, under a process for producing a semiconductor device in accordance with the fourth embodiment of this invention, FIG. 20 a plan view of a semiconductor device in accordance with the fourth embodiment of this invention.

Referring to FIG. 19, an Ag paste or the like is applied to the surface of the grooves 10a, 10b, 10c and 10d of the semiconductor device chip 10, and the semiconductor device chip 10 is placed on the lead frame 18 in a manner similar 8 that which was employed for the foregoing embodiments.

A wire bonding process is conducted in a manner similar to that which was employed for the foregoing embodiments to connect each of the bonding pads 11 with each of the inner leads 16a employing bonding wires 20 made of AU et al.

In a manner similar to that which was described, referring to FIG. 7 above, a plastic molding process is conducted to mold the semiconductor device chip 10. The molded plastic package is shown by label 22.

Figure 20:
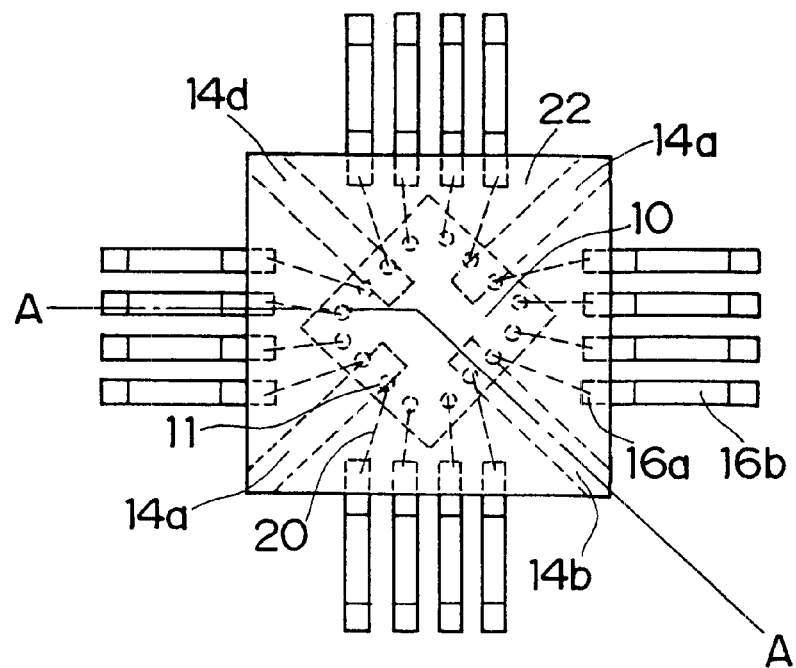

Referring to FIG. 20, each end of the outer leads 16b is discontinued from the frame of the lead frame 18, before each end of the outer leads 16b is deformed into a zigzag shape.

Figure 21:
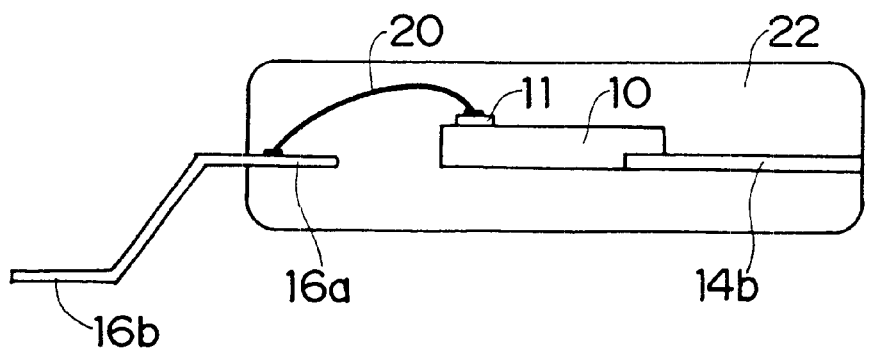
FIG. 21 is a cross section of FIG. 20 taken along line A—A shown in FIG. 20 or a cross section of a semiconductor device in accordance with the fourth embodiment of this invention.

As a result, the cross section of the semiconductor device in accordance with the fourth embodiment of this invention taken along line A—A shown is FIG. 20 becomes as is illustrated in FIG. 21.

In the foregoing example as well, the semiconductor device chip 10 is produced from a semiconductor ingot having a diameter of 300 mm, and the thickness thereof is 450 $\mu$m. The depth of the grooves 10a, 10b, 10c and 10d is selected to be identical to the thickness of the lead frame 18 or 150 $\mu$m. As a result, the rear surface of the connection bars 14a, 14b, 14c and 14d is flush with the rear surface of the semiconductor device chip 10. Allowing a thickness of 27.5 $\mu$m for each of the upper and lower layers of the plastic mold 22 on the top surface of the semiconductor device chip 10 and below the rear surface of the semiconductor device chip 10, the total thickness of the finished or molded semiconductor device in accordance with the fourth embodiment of this invention is successfully made 1.0 mm, fully satisfying the requirement derived from semiconductor devices employable for cellular phones.

The foregoing description has clarified that this invention has successfully provided a semiconductor device packaged in a molded package wherein the finished or molded thickness is in the approximate range of 1.0 mm, despite the thickness range of the semiconductor device chip to be packaged therein is larger than the conventional range of 150 $\mu$m through 300 $\mu$m.

Various modifications of the disclosed embodiments, as well as other embodiments of this invention, will be apparent to persons skilled in the art upon reference to the description of this invention. It is therefore, contemplated that the appended claims will cover any such modifications or embodiments as fall within the true scope of this invention.

What is claimed is:

1. A semiconductor device, comprising:
   a semiconductor device chip which has front and rear surfaces and a groove engraved on the rear surface thereof, the groove extending from corners of the semiconductor device chip toward a central region of the semiconductor device chip, wherein said semiconductor device chip has a thickness substantially greater than about 300 $\mu$m between the front and rear surfaces;
   a die pad which has a size smaller in area than that of the semiconductor device chip and which supports the semiconductor device chip at the central region thereof, and which is placed in the groove;
   connection bars which are connected with the die pad and which support regions on the rear surface adjacent to the corners of the semiconductor device chip, and which are placed in the groove;
   a plurality of bonding pads arranged along sides of the front surface of the semiconductor device chip;
   a plurality of continuous bars comprised of an inner lead and an outer lead, each of the plurality of continuous bars being electrically connected with a respective bonding pad; and
   a mold resin confining the semiconductor device chip, the die pad, the connection bars and the inner lead,
   wherein a total thickness of said semiconductor device is no greater than about 1 mm;
   wherein said semiconductor device chip has a thickness of about 450 $\mu$m; and
   wherein the groove has a depth that is less than ½ of the thickness of said semiconductor device chip.

2. The semiconductor device in accordance with claim 1, wherein the die pad is composed of a plate having a horizontal shape of a quadrilateral and wherein the connection bars are at least two bars.

3. The semiconductor device in accordance with claim 1, wherein the rear surface of the semiconductor device chip is substantially flush with a bottom surface of the die pad and the connection bars.

4. The semiconductor device in accordance with claim 1, wherein the groove extends from at least two respective corners of the semiconductor chip toward the central region of the semiconductor device chip.

5. The semiconductor device in accordance with claim 4, wherein the groove forms a cross at the central region of the semiconductor device chip, the groove further extending from one respective corner of the semiconductor chip to a diametrically opposed corner of the semiconductor chip.

6. The semiconductor device in accordance with claim 5, wherein the connection bars have a similar configuration to the groove, so as to be received therein.

7. The semiconductor device in accordance with claim 5, wherein a portion of the groove in the central region accommodates the die pad therein.

8. The semiconductor device in accordance with claim 1, wherein a total thickness of said semiconductor device is about 1 mm.

9. A semiconductor device, comprising:
   a semiconductor device chip which has front and rear surfaces and at least two straight grooves engraved on the rear surface thereof, each groove extending from corners of the semiconductor device chip toward a central region of the semiconductor device chip;
   a plurality of connection bars which support regions on the rear surface adjacent to the corners of the semiconductor device chip and which are placed in the respective straight grooves, wherein the connection bars include a first bar and a second bar, the first bar being opposite to the second bar, and the first bar being so short as to not reach the second bar but long enough to support a corner of the semiconductor device chip, and wherein a terminal end of the first bar is straight, and a terminal end of the second bar is straight, the respective terminal ends being disposed in respective ones of the grooves;
   a plurality of bonding pads arranged along sides of the front surface of the semiconductor device chip;
   a plurality of continuous bars comprised of an inner lead and an outer lead, each of the plurality of continuous bars being electrically connected with a respective bonding pad; and
   a mold resin confining the semiconductor device chip, the connection bars and the inner lead;
   wherein said semiconductor device chip has a thickness that is substantially greater than about 300 $\mu$m.

10. The semiconductor device in accordance with claim 4, wherein the rear surface of the semiconductor device chip is substantially flush with a bottom surface of the connection bars.

11. The semiconductor device in accordance with claim 4, wherein the grooves form a cross at the central region of the semiconductor device chip, each groove further extending from one respective corner of the semiconductor chip to a diametrically opposed corner of the semiconductor chip.

12. The semiconductor device in accordance with claim 4, wherein said mold resin has about a same thickness both over and under the semiconductor device chip.

13. The semiconductor device in accordance with claim 12, wherein the thickness of said mold resin both over and under said semiconductor device chip is about 27.5 $\mu$m.

14. The semiconductor device in accordance with claim 13, wherein a total thickness of said semiconductor device is about 1 mm.

15. The semiconductor device in accordance with claim 4, wherein a total thickness of said semiconductor device is about 1 mm.

16. The semiconductor device in accordance with claim 15, wherein said semiconductor device chip has a thickness of about 450 $\mu$m.

17. A semiconductor device, comprising:
   a semiconductor device chip having a thickness substantially greater than about 300 $\mu$m;

a die pad which supports the semiconductor device chip;

a connection bar which is connected with the die pad and which supports an edge of the semiconductor device chip;

a groove engraved on a rear surface of the semiconductor device chip, and extending from the edge of the chip toward a central region of the semiconductor device chip;

a centrally disposed recess that is in communication with the groove, the recess accommodating the die pad therein, wherein the groove accommodates the connection bar therein; and a mold resin confining the semiconductor device chip, the die pad and the connection bar, wherein a total thickness of said semiconductor device is no greater than about 1 mm;

wherein said mold resin has about a same thickness both over and under the semiconductor device chip; and wherein the groove has a depth that is less than ½ of the thickness of said semiconductor device chip.

18. The semiconductor device in accordance with claim 17, wherein the recess has a geometrical configuration that is distinct and different from a configuration of the groove.

19. The semiconductor device in accordance with claim 17, wherein the thickness of said mold resin both over and under said semiconductor device chip is about 27.5 µm.

20. The semiconductor device in accordance with claim 19, wherein a total thickness of said semiconductor device is about 1 mm.

21. The semiconductor device in accordance with claim 17, wherein a total thickness of said semiconductor device is about 1 mm.

22. The semiconductor device in accordance with claim 21, wherein said semiconductor device chip has a thickness of about 450 µm.

23. A semiconductor device, comprising:

a semiconductor device chip which has front and rear surfaces and a groove engraved on the rear surface thereof, the groove extending from corners of the semiconductor device chip toward a central region of the semiconductor device chip, wherein said semiconductor device chip has a thickness substantially greater than about 300 µm between the front and rear surfaces;

a die pad which has a size smaller in area than that of the semiconductor device chip and which supports the semiconductor device chip at the central region thereof, and which is placed in the groove;

connection bars which are connected with the die pad and which support regions on the rear surface adjacent to the corners of the semiconductor device chip, and which are placed in the groove;

a plurality of bonding pads arranged along sides of the front surface of the semiconductor device chip;

a plurality of continuous bars comprised of an inner lead and an outer lead, each of the plurality of continuous bars being electrically connected with a respective bonding pad; and a mold resin confining the semiconductor device chip, the die pad, the connection bars and the inner lead, wherein a total thickness of said semiconductor device is no greater than about 1 mm; and wherein said mold resin has about a same thickness both over and under the semiconductor device chip.

24. The semiconductor device in accordance with claim 23, wherein the thickness of said mold resin both over and under said semiconductor device chip is about 27.5 µm.

25. The semiconductor device in accordance with claim 24, wherein a total thickness of said semiconductor device is about 1 mm.

\* \* \* \* \*